(12) United States Patent
Carkner et al.

(10) Patent No.: US 9,759,780 B2
(45) Date of Patent: Sep. 12, 2017

(54) SYSTEM FOR POWER BALANCE MONITORING IN AN ENERGY STORAGE BATTERY

(71) Applicant: Revision Electronics & Power Systems Inc., Ottawa (CA)

(72) Inventors: Steve Carkner, Ottawa (CA); Eric Lanoue, Ottawa (CA)

(73) Assignee: Revision Electronics & Power Systems Inc., Ottawa (CA)

( * ) Notice: Subject to any disclaimer, the term of this patent is extended or adjusted under 35 U.S.C. 154(b) by 97 days.

(21) Appl. No.: 14/371,382

(22) PCT Filed: Dec. 20, 2012

(86) PCT No.: PCT/CA2012/050929
§ 371 (c)(1),
(2) Date: Jul. 9, 2014

(87) PCT Pub. No.: WO2013/104047
PCT Pub. Date: Jul. 18, 2013

(65) Prior Publication Data
US 2014/0347060 A1  Nov. 27, 2014

Related U.S. Application Data

(60) Provisional application No. 61/584,700, filed on Jan. 9, 2012.

(51) Int. Cl.
*H01M 10/46* (2006.01)
*G01R 31/36* (2006.01)
*H02J 7/00* (2006.01)

(52) U.S. Cl.
CPC ..... *G01R 31/3658* (2013.01); *G01R 31/3624* (2013.01); *H02J 7/0014* (2013.01);
(Continued)

(58) Field of Classification Search
CPC ...... H02J 7/0003; H02J 7/0011; H02J 7/0014; H02J 7/0019
(Continued)

(56) References Cited

U.S. PATENT DOCUMENTS 5,898,291 A  4/1999  Hall
7,508,171 B2  3/2009  Carrier et al.
(Continued)

FOREIGN PATENT DOCUMENTS

CA  2758508 A1  10/2010
CA  2782351 A1  6/2011
(Continued)

OTHER PUBLICATIONS

International Search Report and Written Opinion for Application No. PCT/CA2012/050929, dated Apr. 2, 2013.
(Continued)

*Primary Examiner* — Edward Tso
(74) *Attorney, Agent, or Firm* — Wolf, Greenfield & Sacks, P.C.

(57) ABSTRACT

A system for power balance monitoring in an energy storage battery comprising a plurality of energy modules connected in a series-parallel configuration. The energy storage module comprises a plurality of cells. Each module is a three-terminal module. The three terminals comprise a positive output terminal and a negative output terminal for connecting the modules in a series string to a load and an energy sharing terminal for sharing energy between modules is other battery strings. A module power management sub-system comprising a current monitoring circuit is connected to each of the energy sharing terminals. Each module power management sub-system is in communication with a battery power management sub-system so that a weak module can be detected based on module current output. Advanta-
(Continued)

geously, the module power management sub-system is not connected across the main power pathway of the module and so does not appreciably increase module impedance.

6 Claims, 3 Drawing Sheets

(52) U.S. Cl.
CPC .......... *H02J 7/0016* (2013.01); *H02J 7/0021* (2013.01); *H02J 7/00* (2013.01); *Y02T 10/7055* (2013.01)

(58) Field of Classification Search
USPC ................. 320/107, 110, 112, 116–119, 126
See application file for complete search history.

(56) References Cited

U.S. PATENT DOCUMENTS

| | | | |
|---|---|---|---|
| 7,723,955 B2 | 5/2010 | Zaag et al. | |
| 7,786,701 B2 | 8/2010 | Altemose | |
| 2005/0077874 A1* | 4/2005 | Nakao | B60L 3/0046 320/116 |
| 2008/0278115 A1* | 11/2008 | Huggins | B60L 3/12 320/134 |
| 2009/0079390 A1 | 3/2009 | Choi et al. | |
| 2011/0003182 A1 | 1/2011 | Zhu | |
| 2011/0080139 A1* | 4/2011 | Troxel | H01M 10/4207 320/134 |

FOREIGN PATENT DOCUMENTS

| | | |
|---|---|---|
| EP | 1814206 A1 | 8/2007 |
| WO | WO 2006/082425 A1 | 8/2006 |

OTHER PUBLICATIONS

International Preliminary Report on Patentability for Application No. PCT/CA2012/050929, dated Jul. 24, 2014.

* cited by examiner

SYSTEM FOR POWER BALANCE MONITORING IN AN ENERGY STORAGE BATTERY

TECHNICAL FIELD

This invention relates to the field of high power rechargeable battery systems as they relate to both electric vehicle power and renewable home energy systems such as solar and wind power generation. Specifically the invention relates to a system for power balance monitoring in batteries within a high power rechargeable battery system.

BACKGROUND ART

High power battery systems are often composed of a multitude of individual electro-chemical cells that are linked together in a combination of series and parallel connections to generate an overall battery system that has the appropriate voltage, current and energy storage characteristics for the application.

Large battery systems are often broken down into smaller modules for ease of handling, monitoring and replacement. Each individual module will usually include electronics for maintaining the health, charge balance and monitoring of the cells within that module.

For lower power systems, each module may include power control switches that can be used to enable and disable current flow through the module. Monitoring of the amount of current flow may also be provided. For high power systems, the power control switches would be too large and expensive to place inside each module. In these cases, modules placed in series would have current switching and monitoring electronics in one place in series with the entire string of modules. If parallel connection of modules is required to increase energy storage or peak power available, such parallel connections are either done between separate strings of modules, or they are combined tying groups of modules in parallel and then in series.

While the concepts outlined above generally outline the concepts of modular battery systems used in high power situations, the above systems fail to consider how ageing battery packs, and the inclusion of dissimilar capacity modules can adversely affect the safety and performance of the entire energy storage system.

There remains a need for modular energy storage system that will allow a variety of modules to be placed together to form a solution of arbitrary voltage, capacity and power, without the need to laboriously match every module in the system to each other.

Solution to Problem

Technical Solution

The system is a three terminal energy storage device module that can be connected with other modules to form an energy storage system of arbitrary voltage, capacity and power. The two main power terminals allow the modules to deliver most of their energy through a series connected string of modules. The third terminal allows parallel energy sharing and monitoring between modules.

The modules installed in series provide the lowest impedance current flow path to the load, while the third terminal on each module acts like a limited parallel connection.

Monitoring occurrent flow is NOT done on the series path as such a current sensor would need to handle the maximum possible current level of that module. The current sensor would increase the module's total impedance and would therefore degrade overall system performance while simultaneously increasing cost, complexity and failure rates.

Current flow is monitored through the third terminal of the modules. This energy sharing terminal is monitored for current flow and allows the battery management system master to verify that each module in the system is sharing a portion of the load, is operating properly, and that the system remains safe. This energy sharing terminal also provides a path for energy to travel from higher capacity modules to lower capacity modules.

The system can therefore be scaled with an infinite number of modules in series and parallel configurations with the energy sharing terminal performing the parallel connection between modules in a fashion that allows monitoring without increasing the impedance of the main energy path within the modules.

BEST MODE FOR CARRYING OUT THE INVENTION

Figure 3:
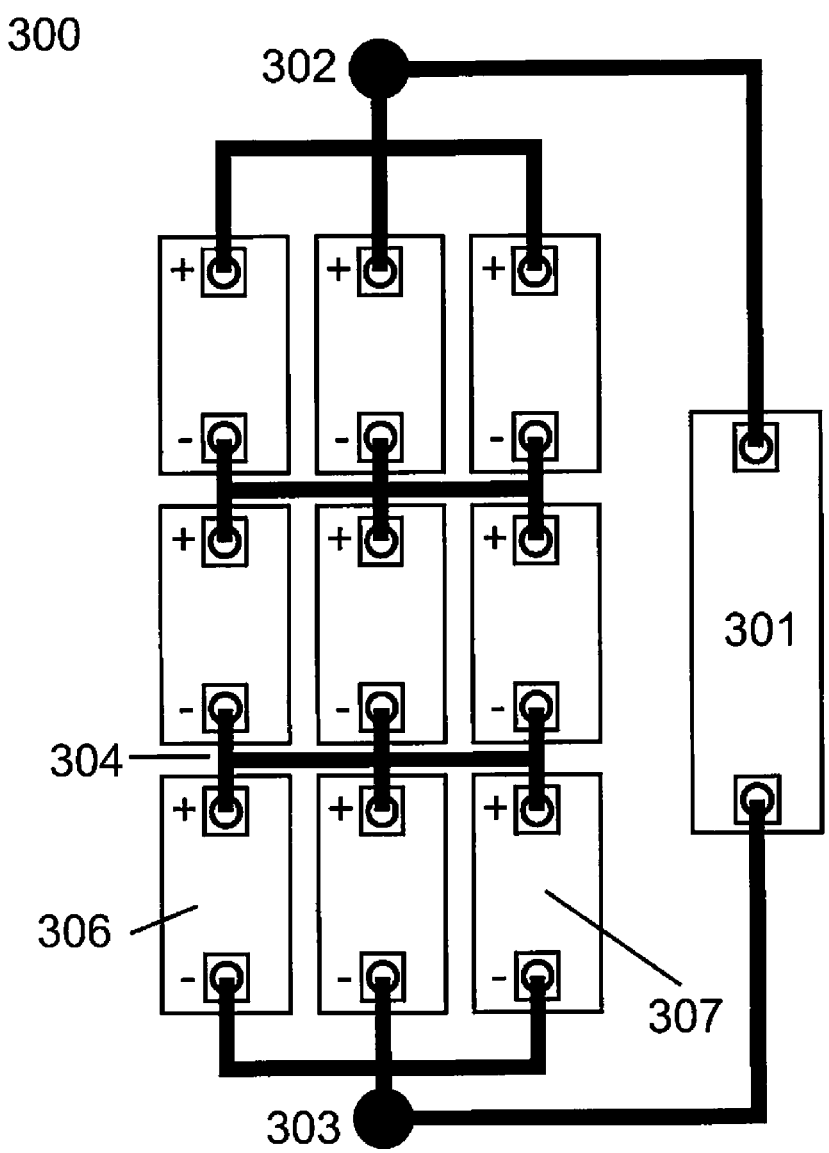
FIG. 3 shows a connection method for modular batteries used in industry.

Referring to FIG. 3, the commonly practised method of connecting battery modules together is shown. This energy storage system (300) is composed of 3 modules in parallel, and then each parallel section is connected as a 3 series high stack of modules. This arrangement is commonly referred to as a 3S3P battery arrangement (3 Series, 3 Parallel). Each module (306) includes two terminals which are connected to other parallel modules using the connection wires (304). The most negative connection becomes the energy storage system negative terminal (303) and the most positive connection becomes the energy storage system positive terminal (302). The positive and negative terminals of the system are then connected to a load (301) which may also include a charging source, electric motor controller, or any other source or consumer of electrical energy.

The commonly practised system of connecting batteries assumes that current flow through the system will be shared equally by each module. In the case where the modules have identical impedance, this would be true. However, if one of the modules is older, has less capacity, is at a different temperature, or any number of other issues is present, then that particular module may contribute less energy to the load than other modules in the system.

Assume that a weak module (307) existed in the system which had 10% less capacity than the other modules. In this case, the voltage on the output of the weak module would be identical to the two other modules in parallel with it. Measuring current flow from the terminal of each module is impractical at very high loads due to the size, complexity, impedance increase and a variety of other factors when considering these high power systems.

In a worst-case scenario, the three modules tied in parallel at the lowest level of the energy storage system would run out of energy before the other modules in the system. As a result the modules may be damaged if they are over discharged, possibly to the point of voltage reversal on their terminals. In the case of battery charging, these modules can become overcharged resulting in system failure and potential safety concerns. If the modules include a battery monitoring system, it is possible for the system as a whole to avoid over charge or over discharge of the three modules. However, since they are connected in parallel, the system monitor (not shown) would have no way to determine which of the three modules is the weak module (307). The user would therefore be faced with removal and individual testing of each module, or they would have to replace all three modules.

Figure 1:
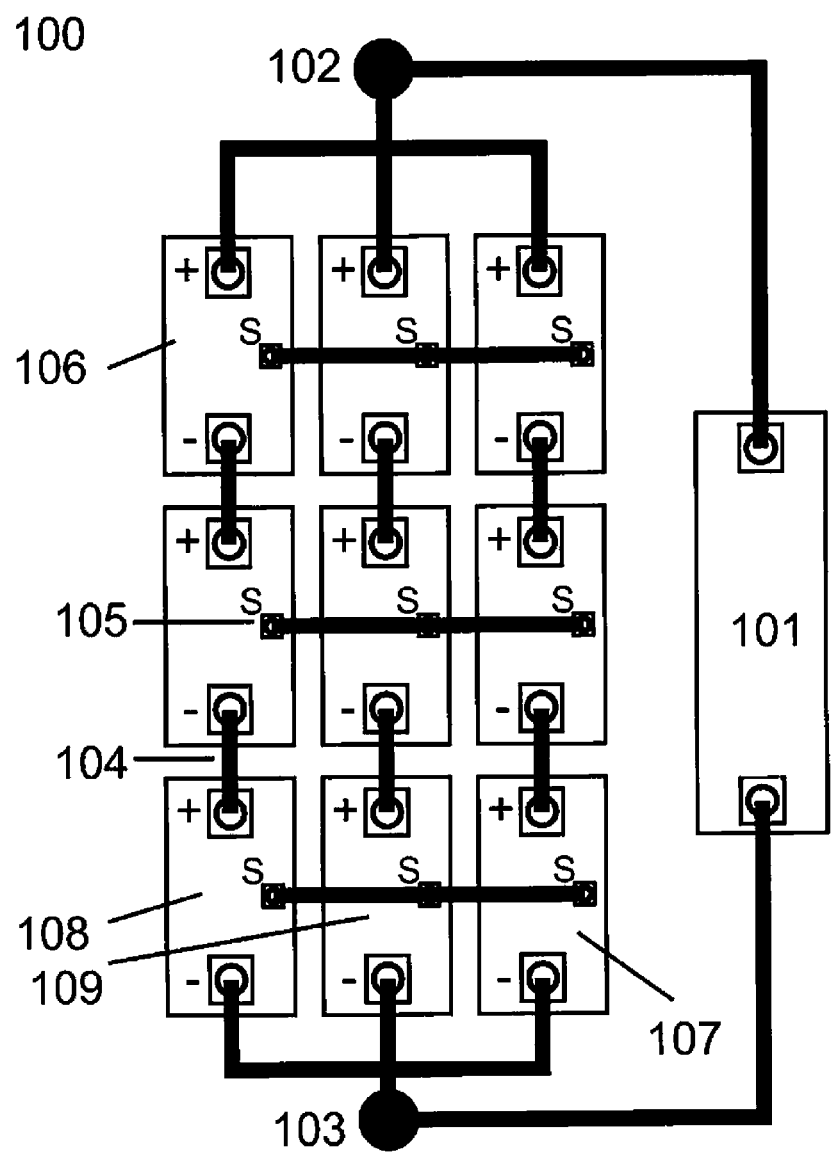
FIG. 1 shows several three terminal modular batteries connected to a load.

FIG. 1 shows a representative energy storage system (100) which is composed of nine identical three-terminal energy storage modules (106). The energy storage system (100) includes a positive output terminal (102) and negative output terminals (103) which are connected to a load (101) or could also be connected to a charge system, electric vehicle motor control, or any other electrical device which is a source or consumer of electrical energy. This system would generally be used with high power loads where high power is considered a load capable of completely charging or completely discharging the energy storage system in less than 1 hour. For lighter loads, conventional interconnection methods could be used including resistive module balancing, tying the battery terminals directly in parallel, or using isolated battery series strings.

The modules are joined in series through a high power connection (104) between their high power terminals. The modules on the same tier of the battery are joined by their energy sharing terminals (105) creating a parallel arrangement of modules.

Assume that a weak module (107) existed in the system which had 10% less capacity than the other modules. In this case, the voltage on the output of the weak module would NOT be identical to the two other modules (108, 109) on that tier of the battery. Instead, the voltage level on the weak module (107) would start to drop a little bit faster than the other modules (108, 109), as a result, energy will now through the energy sharing terminal, this energy will be seen as an inflow of energy to the weak module (107) as the other modules (108, 109) on that tier attempts to prop-up the voltage of the weak module.

Information from the battery management system of each module is shared with a master battery management system (not shown) which can determine exactly which is the weak module (107) by analyzing current flow through the system during normal use. The energy shared between modules on the same tier is only a fraction of the total energy flowing through the system, therefore the current sensors, electronics, connectors and wires used for the energy sharing connections can be much smaller, lighter and cheaper than would be required if only the main terminals on the modules were monitored. Additionally, the failure of the components on the energy sharing terminal would not interrupt the operation of the battery's main current flow path.

An error message may be generated in this case due to the failure of the energy sharing patch, but the load would still continue to be fed power which is a major improvement for mission critical systems.

Figure 2:
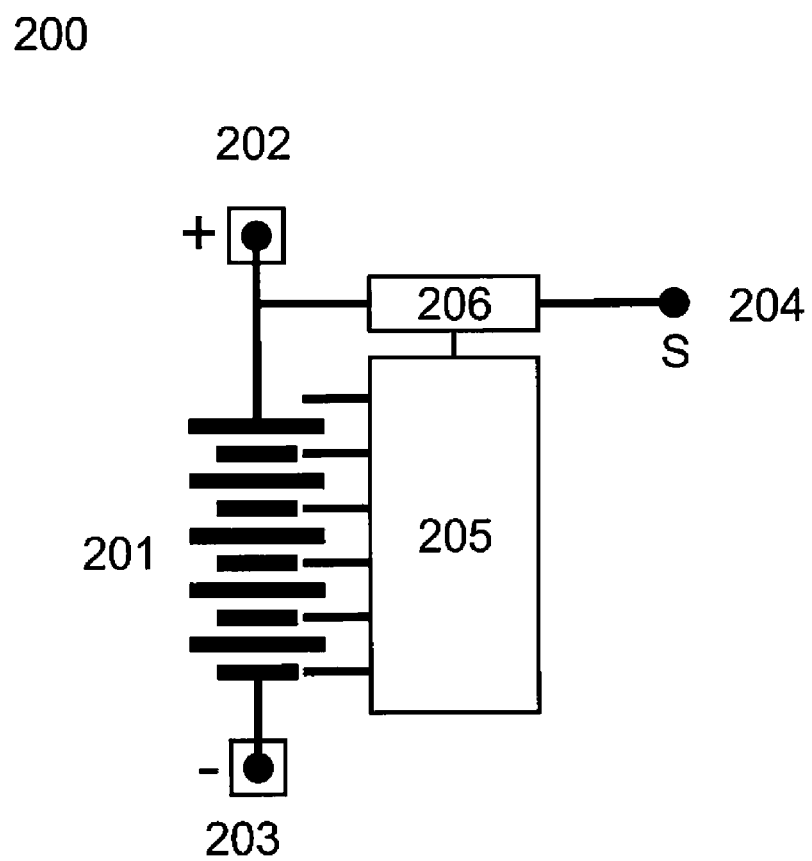
FIG. 2 shows the energy and monitoring paths within each module.

FIG. 2 shows the internal details of a single battery module (200). The module will contain one or more electrochemical cells (201) which are connected in series to the negative output terminal (203) and the positive output terminal (202). No monitoring circuitry exists in the main power path through the battery from the negative terminal (203) to the positive terminal (202) that would increase the overall impedance of the power path by more than 10%. However, in some situations a large current monitor, fuse, or other protection device may be present for gross measurements and safety of the module.

A battery management and monitoring circuit (205) may be present in the module which provides voltage, temperature, parameter monitoring and balancing functions on the cells. This circuit does not impact the impedance of the main power path.

A current monitoring circuit (206) is located in series with the energy sharing terminal (204) and is capable of accurate measurement of current flow into and out of the battery module. The energy sharing terminal may include protection circuitry, switches and fuses to ensure the safety of the module. The impedance of the energy sharing path is expected to be equal to or greater than the total impedance of the main power path through the battery module.

The battery management system (205) and current monitor (206) are in communication with other battery management systems and masters (not shown) to allow those systems to learn the state and control the functions of the battery modules.

The impedance of the energy sharing terminal (204) and circuitry may also be intentionally controlled through passive or active means such as by a resistor or transistor circuit in order to limit and controlled the amount of energy sharing taking place between each module. Controlling the amount of energy sharing would be particularly beneficial in systems with extremely high peak energy demands where the duration of time allotted for sharing energy between modules is longer than the time during which the system is subjected to the very high loads.

The number of modules used in series to create a string of batteries, and the number of strings placed in parallel is unlimited. The example given of a 3×3 matrix of batteries was used for illustrative purposes only and should not be used to limit the scope of the system presented herein.

While the diagrams, explanations and labelling of the systems presented herein refer specifically to electrochemical cell types, polarities and connections, it can be appreciated that one skilled in the art may implement a system with similar intent. Monitoring current on the negative side of the battery module, implementing a different chemistry or varying the size, number or interconnection of the modules shall all be considered part of this application.

What is claimed is:

1. A system for power balance monitoring in an energy storage battery comprising multiple strings of energy storage modules in a simultaneously series and parallel configuration, each of the energy storage modules comprising:
   i. a negative output terminal;
   ii. a positive output terminal for connecting a main power pathway to a load; and
   iii. an energy sharing terminal for connecting to modules of other battery strings' modules, wherein the energy sharing terminal provides a path for energy to travel into and out of the energy storage module for energy sharing between modules, wherein each energy storage module is simultaneously series and parallel connected into a battery by means of the negative output terminal and the positive output terminal, wherein the energy sharing terminal comprises an energy storage module power management sub-system within each energy storage module, the energy storage module power management sub-system comprising:
      1. a voltage monitor;
      2. a current monitoring circuit;
      3. a temperature monitor, wherein the energy storage module power management sub-system receives current data from the current monitoring circuit so that a weak energy storage module can be identified.

2. The system of claim 1, wherein the module power management sub-system is connected to a respective module energy sharing terminal.

3. The system of claim 2, wherein the module power management sub-system is separated from the main power pathway to minimize module impedance.

4. The system of claim 1, wherein the current monitoring circuit is disposed between said positive output terminal and the energy sharing terminal.

5. A system for power balance monitoring in an energy storage battery comprising multiple strings of energy storage modules in a simultaneously series and parallel configuration, each of the energy storage modules comprising:
   i. a negative output terminal;
   ii. a positive output terminal for connecting a main power pathway to a load; and
   iii. an energy sharing terminal for connecting to modules of other battery strings' modules, the energy sharing terminal comprising impedance control means to control energy sharing between modules, wherein each energy storage module is simultaneously series and parallel connected into a battery by means of the negative output terminal and the positive output terminal, wherein the energy sharing terminal comprises an energy storage module power management sub-system within each energy storage module, the energy storage module power management sub-system comprising:
      1. a voltage monitor;
      2. a current monitoring circuit;
      3. a temperature monitor,
wherein the energy storage module power management sub-system receives current data from the current monitoring circuit so that a weak energy storage module can be identified.

6. A system for power balance monitoring in an energy storage battery comprising multiple strings of energy storage modules in a simultaneously series and parallel configuration, each of the energy storage modules comprising:
   i. a negative output terminal;
   ii. a positive output terminal for connecting a main power pathway to a load; and
   iii. an energy sharing terminal for connecting to modules of other battery strings' modules, wherein an impedance of an energy sharing path is greater than an impedance of the main power pathway, wherein each energy storage module is simultaneously series and parallel connected into a battery by means of the negative output terminal and the positive output terminal, wherein the energy sharing terminal comprises an energy storage module power management sub-system within each energy storage module, the energy storage module power management sub-system comprising:
      1. a voltage monitor;
      2. a current monitoring circuit; and
      3. a temperature monitor,
wherein the energy storage module power management sub-system receives current data from the current monitoring circuit so that a weak energy storage module can be identified.

* * * * *